(12) United States Patent
Knight et al.

(10) Patent No.: US 10,702,824 B2
(45) Date of Patent: Jul. 7, 2020

(54) ABATEMENT SYSTEM

(71) Applicant: Edwards Limited, Burgess Hill, West Sussex (GB)

(72) Inventors: Gary Peter Knight, Clevedon (GB); Andrew James Seeley, Clevedon (GB); Duncan Michael Price, Clevedon (GB)

(73) Assignee: Edwards Limited, West Sussex (GB)

( * ) Notice: Subject to any disclaimer, the term of this patent is extended or adjusted under 35 U.S.C. 154(b) by 221 days.

(21) Appl. No.: 15/745,923

(22) PCT Filed: Jun. 15, 2016

(86) PCT No.: PCT/GB2016/051762
§ 371 (c)(1),
(2) Date: Jan. 18, 2018

(87) PCT Pub. No.: WO2017/013381
PCT Pub. Date: Jan. 26, 2017

(65) Prior Publication Data
US 2018/0214812 A1 Aug. 2, 2018

(30) Foreign Application Priority Data

Jul. 22, 2015 (GB) .................................... 1512898.6

(51) Int. Cl.
*B01D 47/10* (2006.01)
*B01D 53/68* (2006.01)
(Continued)

(52) U.S. Cl.
CPC ............. *B01D 47/10* (2013.01); *B01D 53/68* (2013.01); *B01D 53/75* (2013.01); *B01D 53/78* (2013.01);
(Continued)

(58) Field of Classification Search
CPC ...... B01D 2257/108; B01D 2257/2027; B01D 2257/204; B01D 2257/406;
(Continued)

(56) References Cited

U.S. PATENT DOCUMENTS 3,008,807 A * 11/1961 Hilgert .................. C10G 15/00
96/275
2007/0017874 A1* 1/2007 Renaud ..................... C02F 1/20
210/703
(Continued)

FOREIGN PATENT DOCUMENTS

CN 203196509 U 9/2013
DE 1036454 B 8/1958
(Continued)

OTHER PUBLICATIONS

Yung et al., Pressure Loss in Venturi Scrubbers, Journal of Air Pollution Control Association, vol. 27, No. 4, pp. 348-351, 1977.
(Continued)

*Primary Examiner* — Christopher P Jones
(74) *Attorney, Agent, or Firm* — Westman, Champlin & Koehler, P.A.; Theodore M. Magee

(57) ABSTRACT

Venturi Scrubbers are used to separate particulate from a large range of fluids. Many provide additional liquid and/or gas to drive the fluid and aid in the removal of particulate. The present invention provides a liquid ring pump through which the fluid to be treated is first passed and then exhausted, with additional work fluid to a Venturi scrubber such that the particulate can be separated from the exhaust fluid.

12 Claims, 5 Drawing Sheets

(51) Int. Cl.
  *B01D 53/75* (2006.01)
  *B01D 53/78* (2006.01)
  *C23C 16/44* (2006.01)
  *F04C 19/00* (2006.01)

(52) U.S. Cl.
  CPC ........ *C23C 16/4412* (2013.01); *F04C 19/001* (2013.01); *B01D 2257/108* (2013.01); *B01D 2257/204* (2013.01); *B01D 2257/2027* (2013.01); *B01D 2257/406* (2013.01); *B01D 2257/553* (2013.01); *B01D 2258/0216* (2013.01); *C23C 16/44* (2013.01); *Y02C 20/30* (2013.01)

(58) Field of Classification Search
  CPC ...... B01D 2257/553; B01D 2258/0216; B01D 47/10; B01D 53/68; B01D 53/75; B01D 53/78; C23C 16/44; C23C 16/4412; F04C 19/001; Y02C 20/30
  See application file for complete search history.

(56) References Cited

U.S. PATENT DOCUMENTS

2010/0242346 A1*  9/2010  Bunning ................. C07C 67/08
                                                        44/388
2014/0008206 A1*  1/2014  Miller ...................... C10B 7/00
                                                       202/117
2016/0166981 A1*  6/2016  Morgan ............. B01D 53/1493
                                                       423/228

FOREIGN PATENT DOCUMENTS

EP       2631280 A1    8/2013
WO    2008017880 A1    2/2008

OTHER PUBLICATIONS

British Search Report dated Jan. 22, 2016 and Examination Report dated Jan. 25, 2016 for corresponding British Application No. GB1512898.6.
PCT Search Report and Written Opinion dated Oct. 5, 2016 for corresponding PCT Application No. PCT/GB2016/051762.

* cited by examiner

ABATEMENT SYSTEM

CROSS-REFERENCE OF RELATED APPLICATION

This application is a Section 371 National Stage Application of International Application No. PCT/GB2016/051762, filed Jun. 15, 2016, which is incorporated by reference in its entirety and published as WO 2017/013381 A1 on Jan. 26, 2017 and which claims priority of British Application No. 1512898.6, filed Jul. 22, 2015.

FIELD

Embodiments relate to an abatement system for abating effluent gas evacuated from a processing chamber.

BACKGROUND

Abatement systems for abating effluent gas evacuated from a processing chamber are known and may be configured for treating various corrosive or hazardous constituents in the effluent gas stream. For example, when processing semi-conductor wafers deposition and etching steps for example exhaust different constituents and they must be treated appropriately. Also, when cleaning a processing chamber between processing steps further constituents will be exhausted from the processing chamber. Additionally, particulates may be entrained in the exhaust stream, and may include sub-micron particulates, which must be collected by the abatement apparatus.

Embodiments as described in more detail below seek to provide an improved abatement system.

The discussion above is merely provided for general background information and is not intended to be used as an aid in determining the scope of the claimed subject matter. The claimed subject matter is not limited to implementations that solve any or all disadvantages noted in the background.

SUMMARY

Embodiments provide an abatement system for abating effluent gas evacuated from a processing chamber, the abatement system comprising:

a liquid ring pump for compressing and pre-scrubbing gas evacuated from a processing chamber, the liquid ring pump comprising a gas inlet for receiving evacuated gas, a liquid inlet for receiving liquid for generating a liquid ring in a stator of the pump when a rotor rotates in the stator and a gas and liquid outlet for exhausting gas and liquid in a gas/liquid ratio; and a venturi scrubber comprising an inlet for receiving the gas and liquid mixture from the liquid ring pump, a nozzle through which the gas and liquid is conveyed for providing mixing of the gas with the liquid, and a liquid sump for collecting liquid conveyed through the nozzle and a gas outlet for exhausting gas from the venturi scrubber, the liquid ring pump being configured to exhaust gas and liquid at a pressure which drives the gas and liquid through the venturi scrubber.

Other preferred and/or optional aspects of the invention are defined in the accompanying claims.

The Summary is provided to introduce a selection of concepts in a simplified form that are further described in the Detail Description. This summary is not intended to identify key features or essential features of the claimed subject matter, nor is it intended to be used as an aid in determining the scope of the claimed subject matter.

BRIEF DESCRIPTION OF THE DRAWINGS

In order that the embodiments may be well understood, several embodiments thereof, which are given by way of example only, will now be described with reference to the accompanying drawings, in which.

DESCRIPTION OF THE EMBODIMENTS

Liquid ring pumps have been shown to be effective at separating dust particles from a gas stream providing that the typical particle size is relatively large, typically greater than a micron (>1 µm). In this respect, liquid ring pumps are comparable to packed wet scrubber towers in their particle collection efficiency. Venturi scrubbers on the other hand, when operated with an appropriate liquid/gas ratio and relatively high pressure drop across the venturi nozzle (throat) have been used to efficiently collect sub-micron particles and their use in collecting silica ($SiO_2$) fume is well documented. Venturi scrubbers can easily be operated in a continuous fashion whereas an alternative, such as bag filters, need to be periodically taken offline to empty and clean thus requiring either duplex installation or downtime. A venturi scrubber captures particulates, which may be hazardous, as a damp slurry reducing the risk of re-entrainment of the particles into the gas stream, contamination on handling, and inhalation by operatives. However, in order to collect sub-micron particles a venturi scrubber needs to be driven by a pressure drop typically around 250 cm of water. Such pressure drop has typically been provided by expansive roots blowers operating upstream or downstream of the scrubber.

A vacuum system for evacuating a processing chamber may comprise a dry pumping arrangement connected to the chamber and abatement apparatus such as a wet scrubber or combustor located downstream of the dry pumping arrangement. A venturi scrubber provides a significant resistance to the flow of an effluent gas stream exhausted from a process chamber and therefore is therefore not usually considered appropriate for scrubbing such gas flows. Blowers can be used to provide an additional pressure change required to drive a venturi scrubber, either downstream providing suction or upstream providing compression; however such blowers would need to be resistant to potentially highly corrosive effluent gases and be designed so that they did not to provide an ignition source when used with explosive and flammable gas mixtures.

Figure 1:
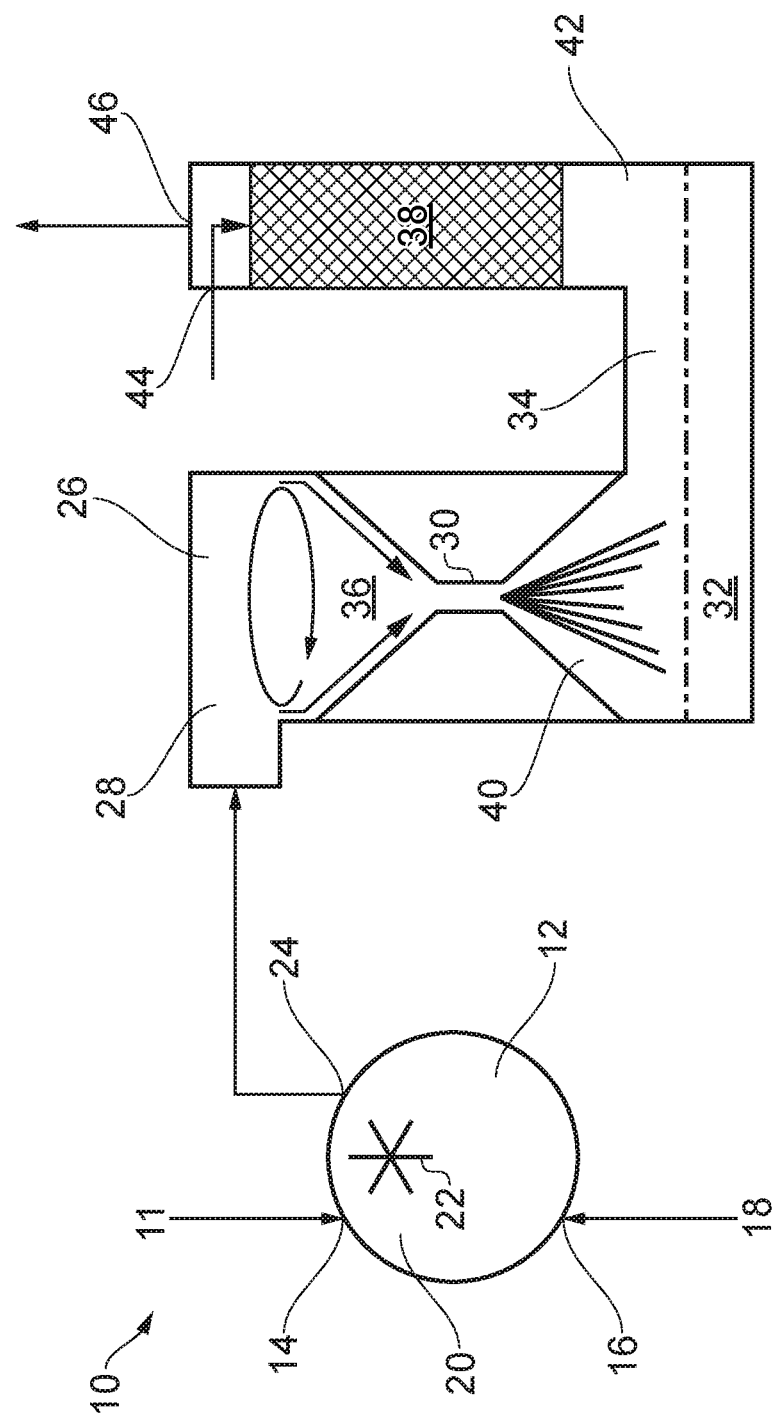
FIG. 1 shows schematically a first abatement system.

Referring to FIG. 1, an abatement system 10 is shown for abating effluent gas 11 evacuated from a processing chamber for example by a dry pumping arrangement (not shown). The dry pumping arrangement evacuates gas at a pressure which may be in the region of 1 mbar to $10^{-6}$ mbar and exhausts the gas stream at a pressure in the region of atmosphere. The abatement system 10 comprises a liquid ring pump 12 for compressing gas evacuated from a processing chamber. The liquid ring pump comprises a gas inlet 14 for receiving evacuated gas from the dry pumping arrangement, a liquid inlet 16 for receiving liquid from a liquid source 18 for generating a liquid ring in a stator 20 of the pump when a rotor 22 rotates in the stator and a gas and liquid outlet 24 for exhausting gas and liquid in a gas/liquid ratio.

The abatement apparatus further comprises a venturi scrubber 26 comprising an inlet 28 for receiving the gas and liquid mixture from the liquid ring pump, a nozzle (otherwise known as a throat) 30 through which the gas and liquid is conveyed for providing mixing of the gas with the liquid, a liquid sump 32 for collecting liquid conveyed through the nozzle and a gas outlet 34 for exhausting gas from the venturi scrubber.

The liquid ring pump 12 is configured to exhaust gas and liquid at a pressure which drives the gas and liquid through the venturi scrubber. In the case of effluent gas containing corrosive constituents the liquid ring pump is constructed to be resistant to corrosive and flammable gas mixtures. The liquid ring pump co-discharges both gas and service liquid in a ratio suitable for the venturi scrubber for promoting scrubbing within the venturi. The mixture of gas and liquid is discharged by the Liquid Ring Pump at pressure and passes through the restriction provided by nozzle 30 via a compression portion 36. The gas exiting the Liquid Ring Pump, a highly efficient scrubber in itself, is further mixed with the service liquid a second time as the mixture is forced through the nozzle 30 via the compression portion 36. In this regard and depending on the constituents of the effluent gas stream, the corrosive constituents dissolve in or otherwise react with the service liquid, particularly in the turbulent flow generated through the nozzle 30. The large difference in velocity of gas and liquid, as the mixture passes through the nozzle and expands into expansion portion 40, aid the entrapment of particulate through a mechanism of impaction of the fast gas-borne particles on fast moving liquid droplets. The size of the water droplets required to capture a particular particulate is proportional to the size of the particulate they are required to capture; that is a finer (smaller) water droplet is required for collecting smaller particulate. The size of the liquid droplets is determined by the speed at which the liquid accelerates through the compression section 36 and nozzle 30 and then a shearing action in the expansion portion 40. The expansion portion 40 also serves to separate the gas from the liquid so that the liquid is retained in the sump 32 whereas scrubbed gas is exhausted from the scrubber through outlet 34. The compression and expansion portions 36, 40 as well as the nozzle 30 are configured according to the ratio of the gas liquid mixture entering the venturi scrubber. The key design parameters for the venturi Scrubbers are the throat diameter, total gas flow, liquid to gas ratio and the pressure drop across the nozzle 30. The nozzle diameter, total gas flow and liquid to gas ratio affect the resultant pressure drop. For efficient particle capture high pressure drops, and consequently large differences in gas and liquid velocities, are required whereas for high gas scrubbing efficiency (for example the capture of acidic compounds) lower gas and liquid velocities are required to increase the contact time between the liquid and effluent gas. As the liquid ring pump has already served as an efficient gas scrubber the pressure drop is optimised for particulate collection. Calvert et al (Yung, Barbarika, and Calvert, J. Air Pollut. Control Assoc., 27, 348, (1977)) have developed equations which allow the pressure drop to be calculated from a knowledge of the gas and liquid properties and the physical dimensions of the venturi scrubber. Using these equations it is possible to optimise the gas to liquid ratio and nozzle dimensions to achieve the necessary pressure drop. Fortuitously the gas to liquid ratio discharged by the LRP is generally around 7 $m^3$ liquid/1000 $m^3$ gas which is within the range of values considered to be optimal for high efficiency particulate capture. Thus for a given total gas load the optimum nozzle dimensions can be easily determined.

In known venturi scrubbers liquid is injected into a liquid inlet of the scrubber from a source of liquid in order to mix with gas entering the venturi through a gas inlet. The liquid is injected in a controlled manner to form a suitable liquid/gas ratio for promoting particulate scrubbing. Injection of liquid in this way requires additional equipment for both determining the amount of liquid injected and actually injecting the liquid into the scrubber. In the present arrangement, due to the use of a liquid ring pump, gas and liquid enter the venturi scrubber together in a suitable ratio for promoting particulate scrubbing. In general, no additional liquid injection means or means for determining the amount of liquid is required with the possible exception of pressure stabilisation of the venturi inlet that may be required for the second and subsequent embodiments.

The venturi scrubber also provides a mechanism for separating the gas and water replacing the separator tank typically used in liquid ring pump installations. The corrosion resistant design of some liquid ring pump permits the use of concentrated acids and thus the service liquid can include recirculated liquid reducing liquid consumption and minimising the waste volume.

In the arrangement shown, an optional liquid scrubbing tower 38 is provided for further scrubbing the effluent gas stream. The wet scrubber 38 has an inlet 42 which receives gas from the exhaust 34 of the venturi scrubber. Fresh liquid can be introduced to the tower through a liquid inlet 44 and scrubbed gas is exhausted through outlet 46. The scrubbing liquid cascades down through the tower 38, over the packed materials to form a film of liquid into which the particulate and any soluble materials in the gas stream are captured.

The abatement system 10 provides in the form of liquid ring pump 12 highly efficient scrubbing of water soluble and hydrolysable gases and in the form of venturi scrubber 26 a highly efficient means of capturing sub-micron particles. The compression of the gas stream by the liquid ring pump provides the necessary motive force to the gas to overcome the pressure drop across the nozzle 30 of the venturi scrubber. In this embodiment the exhaust gas/liquid exhausted from the liquid ring pump enters the top of the venturi scrubber in a tangential direction such that the liquid portion of the exhaust fluid is forced to spin around the inside wall of the frusto-conical venturi scrubber portion 36 before falling into the venturi nozzle 30. This spinning action can be further enhanced by running the liquid stream into a channel concentric to, and outside of, the venturi scrubber such that it forms a liquid weir which then generates a continuously washed water wall down the inside of the venturi scrubber. Calculations and experiments have shown that the venturi nozzle size can be easily chosen to suit the liquid/gas ratio emitted by the liquid ring pump and such that a relatively large pressure drop is created (of the order of 250 cm water) to ensure highly efficient scrubbing of particulate matter. If required (for example due to possible variation in process gas flow), control of the pressure drop can be achieved using an additional recirculated liquid supply to the venturi scrubber inlet that can be varied in relation the gas flow and the desired pressure drop.

In subsequent embodiments of this invention a combustion section, comprising an ignition source and oxidant supply, is positioned between the liquid ring pump exhaust and the venturi scrubber, and operated such that the flammable portion of the waste stream ($SiH_4$, $H_2$ etc) can be steadily and safely combusted. A further refinement of this design is that the combustion section is located concentrically within the water weir, as described above, where the water weir is generated from the water exhausted by the liquid ring pump and which flows down the walls of the venturi scrubber inlet.

In more detail, a second embodiment of this invention outlines a combination of liquid ring pump, combustion section and venturi scrubber suitable for abatement of silane-ammonia mixtures used in the manufacture of silicon nitride (SiN) layers. Using the liquid ring pump upstream of the venturi scrubber to pre-scrub ammonia solves the problem of NOx generation that occurs in the combustion of ammonia, along with the silane, in conventional atmospheric pressure plasma or combustion abatement systems. To improve the scrubbing efficiency, the liquid ring pump can be dosed with an acid, typically sulphuric acid, to further sequester the ammonia. As any oxidant is introduced to the gas liquid flow downstream of the liquid ring pump, the liquid ring pump need only be configured for pumping the gas stream exhausted from the dry pump rather than if it were located downstream of the combustion section, it would be required to have a greater capacity.

Figure 2:
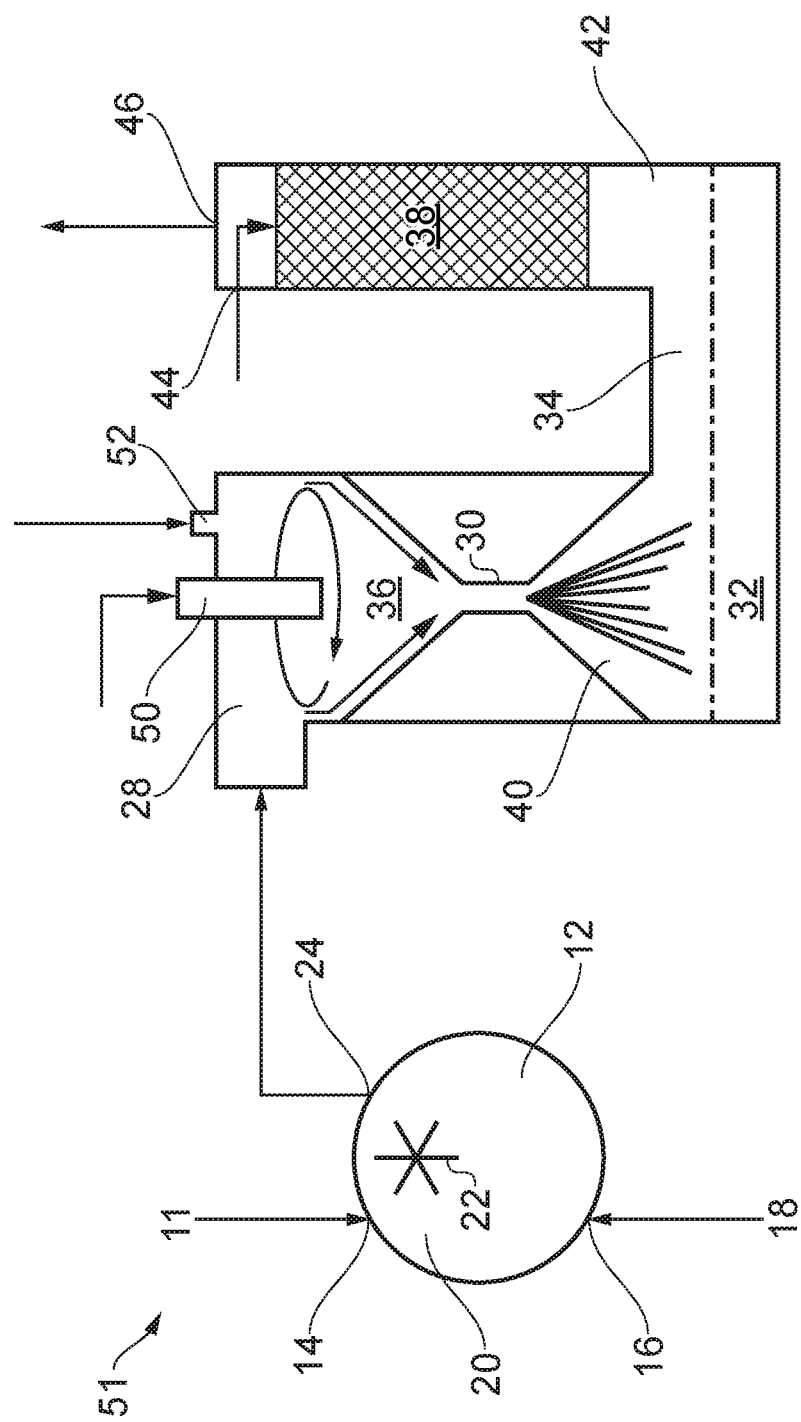
FIG. 2 shows schematically a second abatement system.

The second embodiment as shown in FIG. 2 further comprises a combustion section. The combustion section comprises an oxidant inlet 50, provided for the supply of an oxidant flow into an inlet portion of the venturi scrubber, and an ignition source 52 provided to ignite the effluent gas entering the venturi scrubber. The effluent gas stream mixes with the flow of oxidant, is ignited by the ignition source and thus the effluent gas stream is combusted. The ignition source 52 may be for example a microwave or dc plasma source, fuel/oxidant burner, or electrically heated surface. The oxidant may be for example air or oxygen. The oxidant inlet as shown is formed in the venturi scrubber but in an alternative configuration the inlet may be formed upstream of the venturi inlet 28, and downstream of the liquid ring pump, to form an intimate mixture of effluent gas and oxygen prior to entering the combustion section. In a further refinement to the design the combustion takes place in a space defined at the upper surface of the venturi as shown by the ignition source 52 and oxidant inlet 50 and at its vertical perimeter by the continuously liquid washed wall of the compression section 36 of the venturi scrubber. Thus the combustion products are swept into the venturi nozzle 30 and the walls of the combustion chamber 36 are kept cool and constantly cleaned.

In the second embodiment one or more compatible effluent gas streams contain, for example, but not limited to, ammonia-silane mixtures used for the manufacture of SiN layers. The liquid ring pump 12, using water as the service liquid and possibly dosed with a chemical such as, but not limited to, sulphuric acid, to enhance the scrubbing efficiency, pre-scrubs the incoming gas stream so that, in the case of ammonia-silane mixtures, the gas phase ammonia concentration is significantly reduced before the gas stream enters the combustion section. The provision of the liquid ring pump upstream of the combustion section, particularly when dosed with sulphuric acid, significantly reduces the formation of NOx normally observed during the combustion of ammonia containing gas streams.

Another example of an application for this invention is the deposition of silicon layers e.g. Amorphous or microcrystalline silica used in solar cells. The process often uses mixtures of silane, hydrogen and various dopents ($PH_3$, $GeH_3$ etc) resulting in highly explosive and flammable exhaust gas streams. The tools used in the manufacturing process have multiple chambers that are periodically, and sometimes independently, cleaned with a fluorine containing gas such as nitrogen trifluoride ($NF_3$). This results in a waste gas stream containing a highly oxidising mixture of fluorine $F_2$, silicon tetrafluoride $SiF_4$ and some residual $NF_3$. The deposition gas stream must be prevented from mixing with the cleaning step gas stream because of the risk of explosion and fire.

Figure 3:
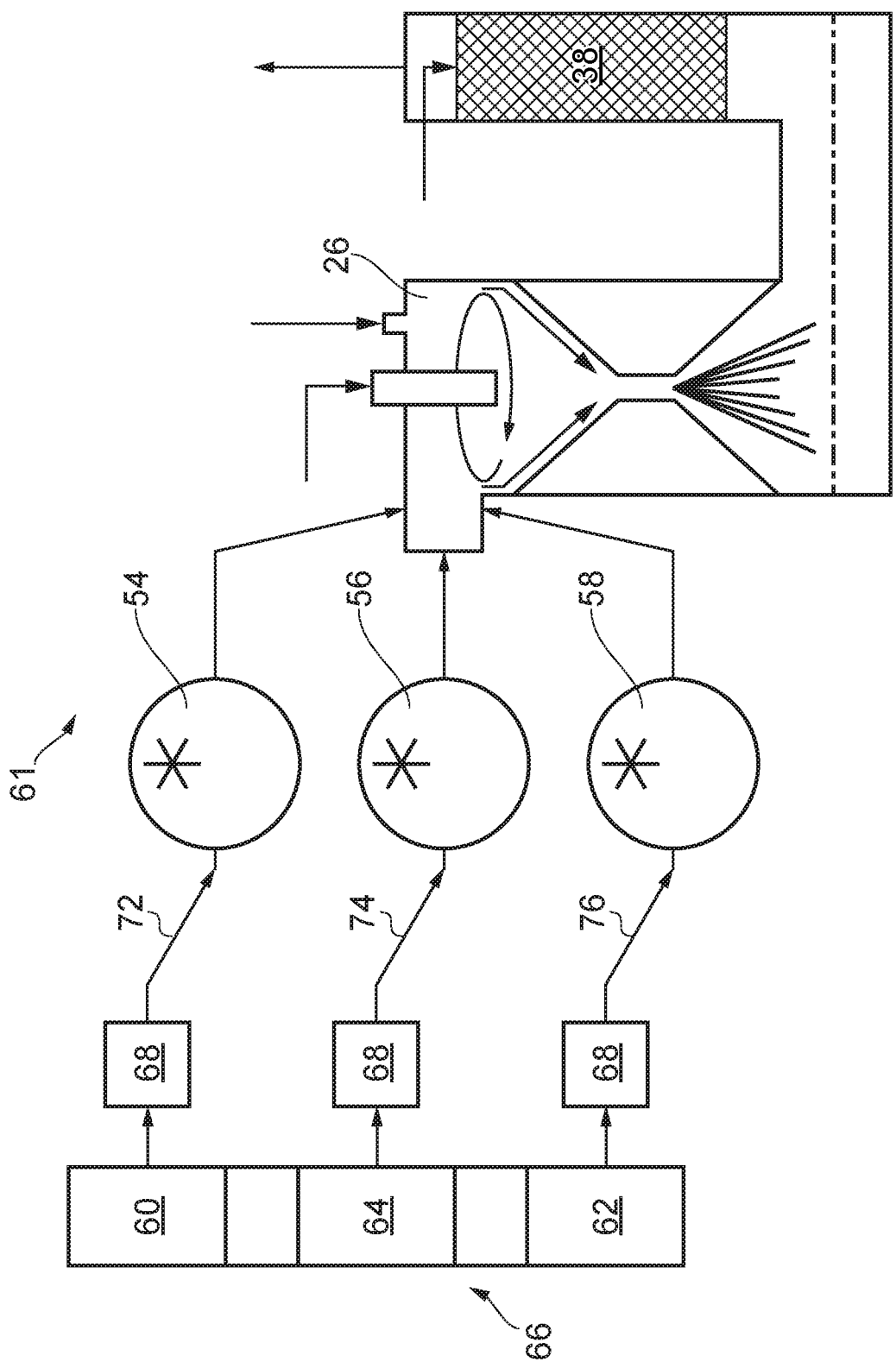
FIG. 3 shows schematically a third abatement system.

In the third embodiment of this invention a plurality of liquid ring pumps 54, 56, 58 (one per chamber 60, 62, 64 of the production tool 66) feed a single venturi scrubber. In this example, three liquid ring pumps are associated with three chambers of a production tool. A dry pumping arrangement 68 which may comprise multiple pumps serves to convey, or evacuate, the effluent gas flow 70, 72, 74 from respective processing chambers. The venturi scrubber 26 and wet scrubbing tower 38 are arranged in the same manner shown in and discussed in relation to FIG. 2 (or if appropriate as shown in FIG. 1 without a combustion section). Each of the liquid ring pumps can be configured for pumping and scrubbing respective effluent gas flows 70, 72, 74, for example, the service liquid of the pump can be selected appropriately for scrubbing the effluent gas flow and/or may be dosed with the appropriate dosing agent such as sulphuric acid as mentioned above. In FIG. 3, the liquid ring pumps 54, 56, 58 are connected to respective chambers 60, 62, 64 in parallel such that effluent gas exhausted from each of the chambers has a dedicated liquid ring pump for pumping and scrubbing. In another arrangement, one or more of the liquid ring pumps can be switched in to any one of the chambers, for example, so that one of the liquid ring pumps is arranged to pump effluent gas (e.g. 72) from one chamber 60 during processing and another of the liquid ring pump is arranged to pump effluent gas (e.g. 74) from that chamber 60 during cleaning. This allows the clean step gases (e.g. $F_2$ and $SiF_4$) to be pre-scrubbed before entering the venturi scrubber and thus eliminates the possibility of incompatible gas streams mixing. An additional benefit of this embodiment is that using a liquid ring pump can generate a reduced pressure in the exhaust lines of the conventional dry pumps, reducing their power consumption and improving the pumping speeds of hydrogen through the system. In this regard, the dry pump or pumps may be arranged to exhaust at a pressure below atmosphere and the respective liquid ring pumps are arranged to increase pressure of the pumped gas sufficiently to drive the venturi scrubber for example to 250 cm of water. The same efficiency saving can be applied to any of the embodiments described herein.

The third embodiment, and subsequent embodiments, of this invention concerns the abatement of multiple gas streams 72, 74, 76 where there is a possibility that the gas streams may be incompatible with each other. The incompatibility of the gas streams is avoided by prior scrubbing by respective liquid ring pumps. For example, in the manufacture of silicon layers, gas mixtures containing silane, hydrogen and various dopents (e.g. Phosphine and Germane) are used for the actual deposition chemistry but the production tool, often equipped with multiple, independently controlled, chambers 60, 62, 64 also periodically use mixtures of fluorine containing gases (e.g. Nitrogen trifluoride) to plasma clean the chambers. This cleaning step liberates highly oxidising waste gas streams containing, among other things, fluorine, silicon tetrafluoride and residual nitrogen trifluoride. The mixing of the highly flammable deposition chemicals (e.g. Silane, hydrogen) with the clean step gases and their reaction by-products must be prevented because of the obvious risk of fire and explosion. To that end, in the third embodiment of this invention, each process chamber waste gas stream 72, 74, 76 exiting the dry pumps 68 enters a separate liquid ring pump for independent pre-scrubbing. In the example given above for silicon layer deposition the liquid ring pumps scrub the fluorine containing species (with the exception of the nitrogen trifluoride) before it enters the combustion section so preventing the mixing of incompatible gas streams. Also, the additional pumping by the liquid ring pump also improves the speed of pumping of molecular hydrogen containing gas streams and reduces the power consumption of the dry pumps.

In the fourth embodiment of this invention two liquid ring pumps are employed. A first liquid ring pump is arranged to pump the deposition gases and a second liquid ring pump is arranged to pump the cleaning step gases with foreline valves and pipework to direct clean and deposition gases to the appropriate first and second liquid ring pumps. These two liquid ring pumps then feed a single venturi scrubber. The venturi scrubber 26 and the optional scrubbing tower 38 are as described previously in FIG. 1, 2 or 3.

This also allows the clean step gas stream (e.g. $F_2$ and $SiF_4$) to be pre-scrubbed before entering the combustion section and venturi scrubber and thus eliminates the possibility of incompatible gas streams mixing. Like the third embodiment the use of a liquid ring pump generates a reduced pressure in the exhaust lines of the conventional dry pumps, reducing their power consumption and improving the hydrogen pumping speeds.

Figure 4:
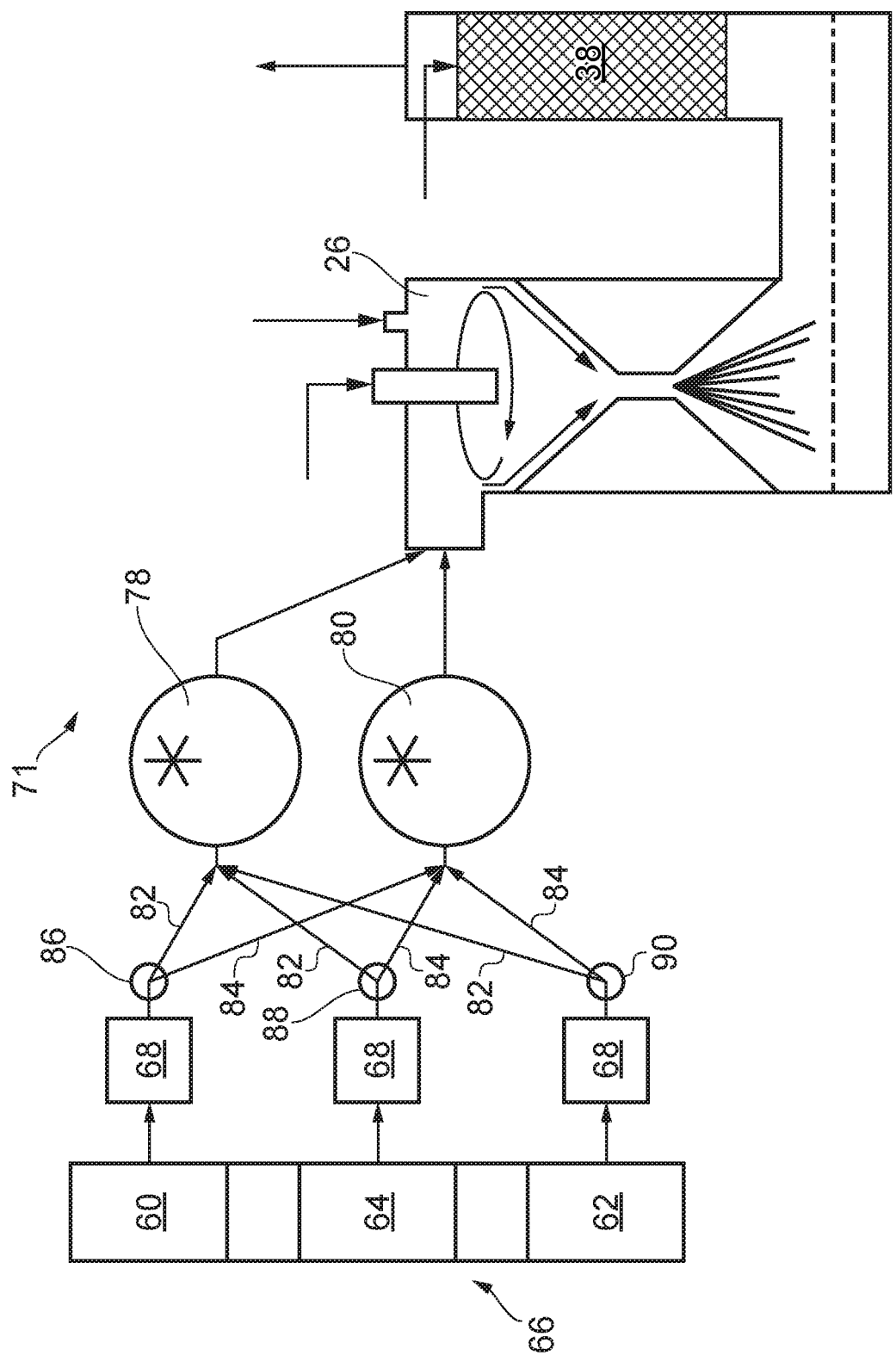
FIG. 4 shows schematically a fourth abatement system.

As shown in FIG. 4, in the fourth embodiment the requirement for an individual liquid ring pump or liquid ring pumping stage per process chamber 60, 62, 64 is avoided by using a bank of 3-way valves, one per process chamber (or per processing/cleaning step or stage), to direct the process flows to one of a fewer number of liquid ring pumps, or two liquid ring pumps for three chambers/steps as shown in FIG. 4. The venturi scrubber 26 and tower 38 as shown are as shown in, and discussed in relation to, FIG. 2 (or if appropriate as shown in FIG. 1 without a combustion section). One liquid ring pump 78 is arranged for receiving the deposition waste gas stream 82 and one liquid ring pump 80 for receiving the clean gas waste stream 84. In more detail, three valves 86, 88, 90, which are preferably at least three-way valves, are provided for conveying gas from a chamber to a selected one of the liquid ring pumps 78, 80. For example, effluent gas exhausted from chamber 60 during a processing step is conveyed to liquid ring pump 78 by valve 86 and during a chamber cleaning step is conveyed to liquid ring pump 80. Liquid ring pumps 78, 80 may be configured respectively for treating processing gas effluent streams and cleaning gas effluent streams. Alternatively, one liquid ring pump 78 could be configured for treating effluent gas exhausted during a first process step, for example a deposition step whilst a the second liquid ring pump 80 could be configured for treating gas exhausted during a second processing step, for example an etching step. The deposition waste gas stream can then be directed into the combustion section as outlined in the second embodiment or as detailed below in the fifth embodiment directly into the ignition source.

In both the third and fourth embodiments the deposition gas streams are conveyed through a liquid ring pump 54, 56, 58; 78, 80. Although the typical constituents of the deposition streams do not react with, or dissolve in, water the gas stream is often laden with particles. A significant portion of the particles are removed by the passage through the liquid ring pump, particularly micron sized particles or above, reducing the burden on the combustion section where such particle laden gas streams could potentially cause blockages.

In the fifth embodiment of this invention, foreline valves and pipework direct the clean step gases to a single liquid ring pump for pre-scrubbing and the deposition gases directly into the combustion section within a single venturi scrubber.

Figure 5:
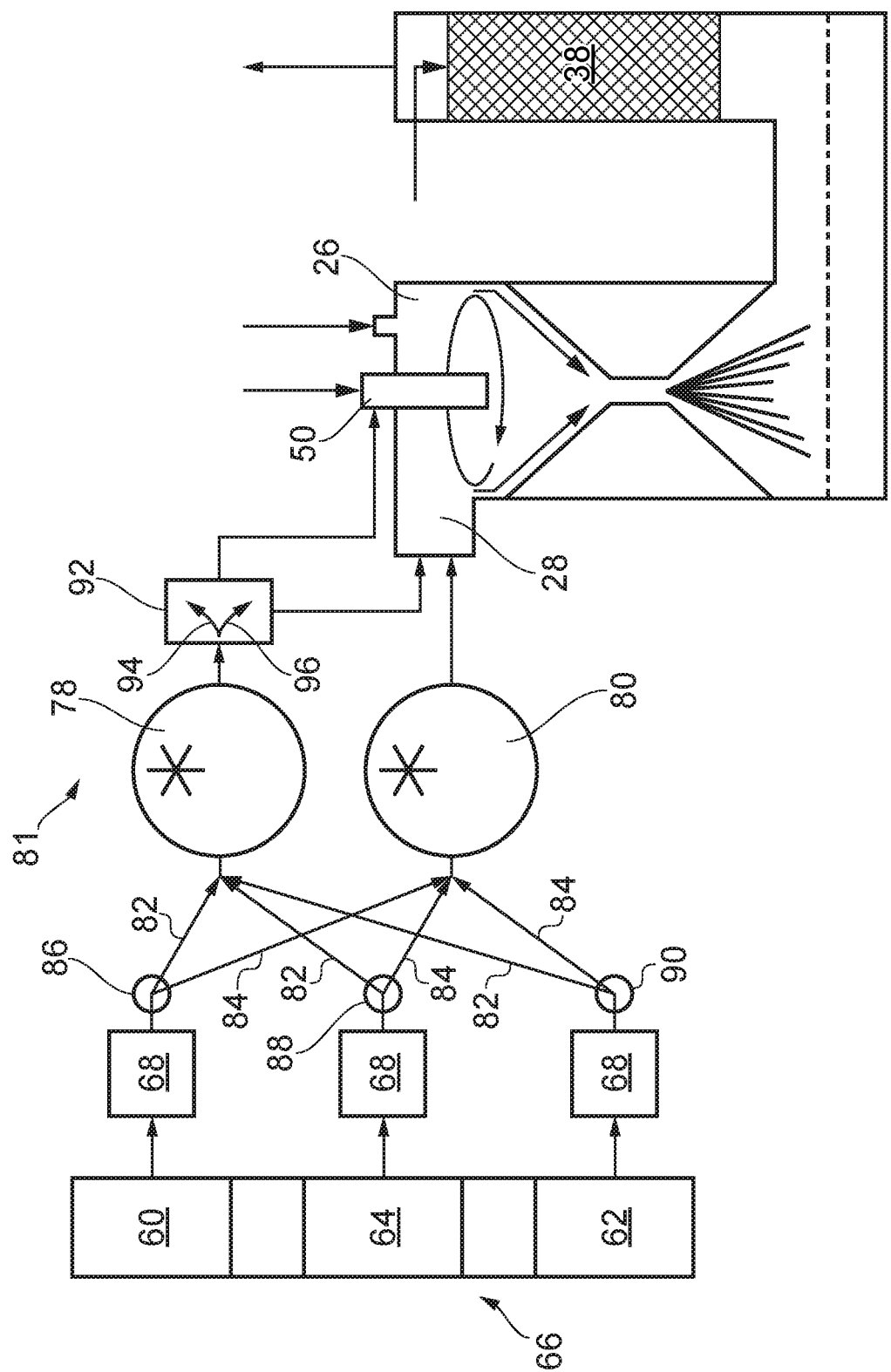
FIG. 5 shows schematically a fifth abatement system.

In the fifth embodiment shown in FIG. 5, a bank of 3-way valves 86, 88, 90 as described in the fourth embodiment are used to selectively convey effluent gas 82, 84 from a chamber 60, 62, 64 to one of a plurality of liquid ring pumps 78, 80. In one arrangement, the clean and deposition step effluent gas streams are conveyed to respective liquid ring pumps for pre-scrubbing so that the clean and processing step effluent gas stream do not become mixed prior to pre-scrubbing by the liquid ring pumps. Pre-scrubbing conditions the effluents gas streams so that the potential hazard associated with mixing the gas streams is reduced. The deposition waste gas stream (including gas and service liquid), after pre-scrubbing and compression in the liquid ring pump, is conveyed to a gas and liquid separator 92. The gaseous portion 94 is conveyed into oxidant supply nozzle 50 of the combustion section for pre-combustion. The liquid portion 96 of the pre-scrubbed deposition waste gas stream drains into the inlet 28 of the venturi scrubber 26. The cleaning step effluent gas stream is conveyed to the inlet 28 of the venturi scrubber 26 without passing through the separator 92. This arrangement increases the degree of separation of deposition waste gas from clean step waste gas enhancing the safety of the operation. Allowing the clean step waste gas stream to mix with the already pre-combusted deposition waste gas stream enhances the destruction of fluorine containing species remaining in the gas stream after-scrubbing in the liquid ring pump, in particular the residual nitrogen trifluoride.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

The invention claimed is:

1. An abatement system for abating effluent gas evacuated from a processing chamber, the abatement system comprising:
    a liquid ring pump for compressing and pre-scrubbing gas evacuated from a processing chamber, the liquid ring pump comprising a gas inlet for receiving evacuated gas, a liquid inlet for receiving liquid for generating a liquid ring in a stator of the pump when a rotor rotates in the stator and a gas and liquid outlet for exhausting gas and liquid in a gas/liquid ratio; and
    a venturi scrubber comprising an inlet for receiving the gas and liquid mixture from the liquid ring pump, a conical inlet portion wherein the inlet is arranged to convey the gas and liquid mixture tangentially to the conical inlet portion such that the liquid portion of the mixture is forced to spin around an inside wall of the venturi scrubber, a nozzle, downstream of the conical inlet portion, through which the gas and liquid is conveyed for providing mixing of the gas with the liquid, and a liquid sump for collecting liquid conveyed through the nozzle and a gas outlet for exhausting gas from the venturi scrubber, the liquid ring pump being configured to exhaust gas and liquid at a pressure which drives the gas and liquid through the venturi scrubber and wherein the gas/liquid ratio of the effluent gas stream exhausted from the liquid ring pump is adapted to promote scrubbing by the venturi scrubber.

2. The abatement system as claimed in claim 1, comprising a combustor located to combust effluent gas exhausted from the liquid ring pump prior to passage of the gas stream through the nozzle of the venturi scrubber.

3. The abatement system as claimed in claim 2, wherein the combustor comprises an oxidant inlet for the supply of an oxidant flow into an inlet portion of the venturi scrubber and an ignition source located to ignite the effluent gas entering the venturi scrubber in the flow of oxidant for combusting the effluent gas stream.

4. The abatement system as claimed in claim 3, wherein the oxidant inlet is formed in the venturi scrubber and the ignition source extends into the venturi scrubber for combusting effluent gas in the venturi scrubber.

5. The abatement system as claimed in claim 1, comprising a plurality of said liquid ring pumps arranged for compressing and pre-scrubbing effluent gas exhausted from respective processing chambers, wherein the liquid rings pumps are configured for the respective effluent gas streams exhausted by said chambers.

6. The abatement system as claimed in claim 1, comprising a plurality of said liquid ring pumps arranged for compressing and pre-scrubbing effluent gas exhausted during respective processing and cleaning steps in one or more process chambers, wherein the liquid rings pumps are configured for the respective effluent gas streams exhausted during processing and cleaning steps.

7. The abatement system as claimed in claim 5, wherein said plurality of liquid ring pumps exhaust an effluent gas and liquid mixture to said venturi scrubber.

8. The abatement system as claimed in claim 5, comprising at least one valve located between a said process chamber and the plurality of liquid ring pumps for conveying effluent gas exhausted from said processing chamber to a selected one of said liquid ring pumps dependent on the step carried out in the process chamber during which effluent gas is generated.

9. The abatement system as claimed in claim 8, wherein said valve is a three way valve and conveys effluent gas generated during a process step to a first said liquid ring pump and effluent gas generated during a cleaning step to a second said liquid ring pump.

10. The abatement system as claimed in claim 8, comprising a plurality of valves located between respective process chambers and the liquid ring pumps for conveying effluent gas exhausted from respective said process chambers to a selected one of the liquid ring pumps dependent on the step carried out in the process chamber during which effluent gas is generated.

11. The abatement system as claimed in claim 10, wherein said valves are three way valves and convey effluent gas generated in respective process chambers during a process step to a first said liquid ring pump and effluent gas generated during a cleaning step to a second said liquid ring pump.

12. The abatement system as claimed in claim 1, comprising a wet scrubber located downstream of the venturi scrubber for wet scrubbing gas exhausted from the venturi scrubber.

* * * * *